US00RE47855E

(19) United States
(12) Reissued Patent
Wang et al.

(10) Patent Number: US RE47,855 E
(45) Date of Reissued Patent: Feb. 11, 2020

(54) SWITCHING REGULATOR POWER SUPPLY WITH CONSTANT CURRENT OPTION

(71) Applicant: NOKIA SHANGHAI BELL CO., LTD, Shanghai (CN)

(72) Inventors: Jing Wang, Unionville, CT (US); Gordon M. Siebert, Windham, CT (US)

(73) Assignee: Nokia Shanghai Bell Co., Ltd., Shanghai (CN)

(21) Appl. No.: 15/782,407

(22) Filed: Oct. 12, 2017

Related U.S. Patent Documents

Reissue of:
(64) Patent No.: 9,571,047
Issued: Feb. 14, 2017
Appl. No.: 14/615,690
Filed: Feb. 6, 2015

(51) Int. Cl.
*H03F 1/52* (2006.01)
*H03F 3/19* (2006.01)
*H03F 1/02* (2006.01)

(52) U.S. Cl.
CPC ..... *H03F 3/19* (2013.01); *H03F 1/0211* (2013.01); *H03F 1/52* (2013.01); *H03F 2200/294* (2013.01); *H03F 2200/321* (2013.01); *H03F 2200/351* (2013.01); *H03F 2200/451* (2013.01); *H03F 2200/462* (2013.01)

(58) Field of Classification Search
CPC . H03F 3/19; H03F 1/0211; H03F 1/52; H03F 2200/294; H03F 2200/321; H03F 2200/351; H03F 2200/451; H03F 2200/462; H03F 1/02
USPC ..... 330/51, 123, 127, 199, 250, 297, 207 P; 323/234, 277, 361; 455/117, 127.1, 298, 455/299, 243.1, 343.6, 418, 572
See application file for complete search history.

(56) References Cited

U.S. PATENT DOCUMENTS 5,548,206 A * 8/1996 Soo ..... H02M 3/1588 323/224
6,222,356 B1 * 4/2001 Taghizadeh-Kaschani ..... H02M 3/1563 323/288
6,438,462 B1 * 8/2002 Hanf ..... G06F 1/3203 340/693.4
8,866,548 B2 * 10/2014 Drogi ..... H03C 1/00 330/127

(Continued)

FOREIGN PATENT DOCUMENTS

CN 102307365 A * 1/2012

*Primary Examiner* — My Trang Ton
(74) *Attorney, Agent, or Firm* — Mendelsohn Dunleavy, P.C.; Yuri Gruzdkov

(57) ABSTRACT

A dual mode regulator provides power to a tower mounted low noise amplifier (LNA) and operates in either one of two modes. The dual mode regulator comprises a microcontroller that controls the amplifier and two regulators to operate in an Antenna Interface Standards Group (AISG) mode when the microcontroller is detecting AISG protocol information or in a current window alarm (CWA) mode when the microcontroller is not receiving AISG protocol information. In the CWA mode the total current to the two regulators and associated circuitry is maintained at a constant amplitude. Further in the CWA mode, the microcontroller is able to generate an alarm signal and deactivate the amplifier when it detects improper operation by the amplifier. In the AISG mode, a single regulator is used and the other regulator is de-activated by the microcontroller.

25 Claims, 2 Drawing Sheets

(56) References Cited

U.S. PATENT DOCUMENTS

| | | | | |
|---|---|---|---|---|
| 2010/0279730 | A1* | 11/2010 | Ortiz | H04B 1/0057<br>455/550.1 |
| 2011/0105099 | A1* | 5/2011 | Roll | H04L 67/025<br>455/418 |
| 2013/0093251 | A1* | 4/2013 | Kondo | H02M 3/1584<br>307/82 |
| 2015/0048883 | A1* | 2/2015 | Vinayak | H02M 3/06<br>330/127 |

* cited by examiner

100

SWITCHING REGULATOR POWER SUPPLY WITH CONSTANT CURRENT OPTION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATIONS*

*This application is a reissue to U.S. patent application Ser. No. 14/615,690, filed 06 Feb. 2015, and entitled "Switching Regulator Power Supply with Constant Current Option."*

BACKGROUND

Technical Field

Example embodiments generally relate to a regulator and a method for operating same and particularly, but not exclusively to a dual mode regulator for an amplifier.

Description of the Related Art

Amplifiers that are part of equipment used at base stations to amplify signals received by and/or transmitted to power equipment to remotely control the orientation of one or more antennas positioned at a tower of a base station. Many of these amplifiers are mounted at the top of a tower of a base station and are thus referred to as Tower Mounted Amplifiers (TMA). TMAs operate in accordance with a certain standard called the Current Window Alarm (CWA) mode. The CWA mode of operation, which is a legacy mode of operation, is still used in many base station towers. In the CWA mode, the regulators for the amplifiers used at the base station are required to operate for a range of input voltages provided by the base station equipment while providing a constant DC current (having a defined amplitude) to the amplifiers. Further, the regulators are to monitor the current used by the amplifiers and enter an alarm mode if such current becomes appreciably greater than the defined constant amplitude level. Moreover, while in the alarm mode, the regulators are required to sink an alarm current by changing the duty cycle of the PWM pulses applied to a current load to achieve a desired DC current amplitude. That is, the regulators are able to intentionally sink large currents being provided by the base station to generate this alarm signal. Linear regulators are used in these CWA systems because linear regulators are able to provide a constant current for a range of input voltages. However, these linear regulators achieve this feature by simply dissipating the additional current they need to meet the constant current requirement or the large current they need to generate the alarm signal through resistive loads. As such these CWA legacy systems are very inefficient as they waste relatively large amounts of energy to meet their operational requirements.

The switching regulator is widely used for its high energy efficient operation. These regulators operate in accordance with the Antenna Interface Standards Group (AISG), which allows exchange of messages (formatted as per a certain recognized protocol) between the base station equipment and the TMAs that remotely control the electrical tilt of antennas mounted at the top of base station towers. AISG messages are exchanged in a virtually continuous fashion between tower mounted equipment and other base station equipment. In addition to the switching regulators being energy efficient (relative to the linear regulators), there is no requirement for generating an energy wasting alarm signal such as the alarm signal required by base stations still operating in accordance with the CWA mode. In the AISG base stations, a message informing of an alarm condition is simply used to inform the base station of the occurrence of an alarm.

Unfortunately, many communication systems still use antenna systems that still adhere to the CWA approach. However the need and desire for AISG type approach is clear.

SUMMARY

At least one example embodiment relates to a dual mode regulator for an amplifier. In one example embodiment, the dual mode regulator for an amplifier comprises a microcontroller, a first regulator for driving the amplifier, a variable dummy current load (VDCL) controlled by the microcontroller, and a second regulator for driving the variable current dummy load. The respective inputs of the regulators form a main path that is coupled to a power source with the main path carrying a total current that is applied to the regulators and the first regulator provides an operating current to the amplifier.

In a first mode of operation, the microcontroller controls the VDCL and amplifier to maintain a constant total current and the microcontroller generates an alarm signal upon detecting an alarm based on amplitudes of the total current or the operating current of the amplifier or both. In a second mode of operation, the microcontroller de-activates the VDCL.

At least one example embodiment relates to a method for operating a dual mode regulator for an amplifier, the method comprises determining whether the dual mode regulator system is to operate in a first mode or a second mode; operating the dual mode regulator system in one of the first and second modes and activating the amplifier where the system is operated based on a protocol signal received by the system; and entering into an alarm mode and de-activating the amplifier when the system detects an alarm condition. The terms "activate" or "activating" refers to a component, device or circuit being provided the proper amount of energy and signals to be able to operate in a manner for which such component, device or circuit was designed. Conversely, the terms "de-activate" or "de-activating" refers to a component, device or circuit not able to operate at all, or not able to operate in the manner for which it was designed even when the proper power and signals are provided to such component, device or circuit, or both.

In example embodiments of the dual mode regulator for an amplifier and a method for operating a dual mode regulator for an amplifier, the first mode is a CWA mode and the second mode is an AISG mode.

BRIEF DESCRIPTION OF THE DRAWINGS

The following are drawings of some of the exemplary embodiments of this disclosure. Other aspects, features, implementations and benefits of these and other embodiments will be more clearly understood from the following detailed description taken in conjunction with the accompanying drawings.

FIG. 1 illustrates a dual regulator system according to an example embodiment;

FIG. 2 illustrates a method of operation of a dual regulator system according to an example embodiment.

DETAILED DESCRIPTION

Figure 1:
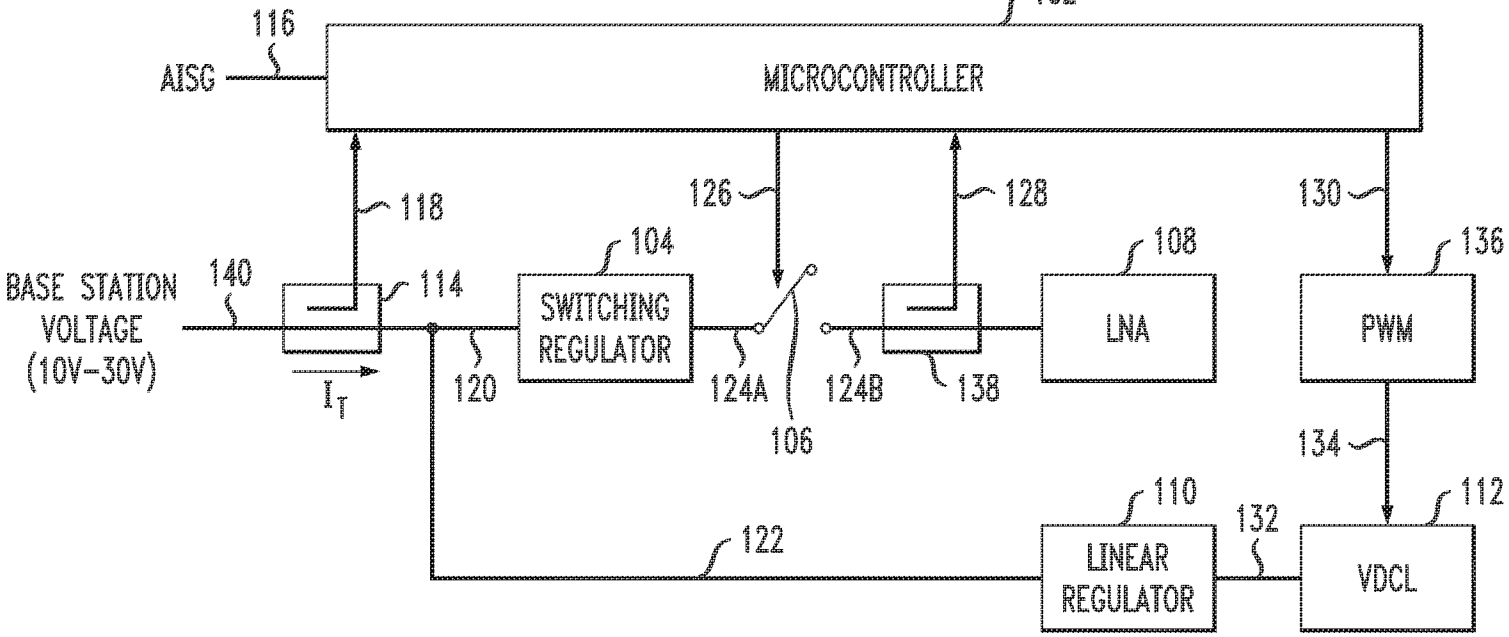
FIGS. 1-2 represent non-limiting, example embodiments as described herein.

Various example embodiments will now be described more fully with reference to the accompanying drawings in which some example embodiments are illustrated. Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications; equivalents, and alternatives falling within the scope of the claims. Like numbers refer to like elements throughout the description of the figures.

As used herein, the term "and/or" includes any and all combinations of one or more of the associated listed items. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). It will be further understood that the term "path" as used herein refers to any electrically conductive medium that allows conduction of electrical current from one point to another point of a circuit or system. A path is used to conduct current between any two points of a circuit or between any two electrical components of a circuit (without any intervening components). A path may be used to conduct control signals; such a path is referred to as a "control path." Control signals as used herein are signals that directly cause a desired result when applied to a specific point in a circuit or system.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and unless so defined herein will not be interpreted in an idealized or overly formal sense.

Referring to FIG. 1, an embodiment of the dual mode regulator for an amplifier is shown coupled to a Low Noise Amplifier (LNA) 108. It will be readily understood that the amplifier 108 is not limited to an LNA, but may be other types of amplifiers that can be used by other embodiments of the dual mode regulator. For ease of description, suppose the amplifier is a TMA that is part of circuitry used to control antenna equipment (not shown), and in particular to control the tilting angle (or other orientations) of one or more antennas positioned at the top of the tower of a base station. The base station may, for example, be part of a communication network or system. A protocol comprising various commands or instructions sent to circuitry associated with controlling the orientation (e.g., tilt angle) of one or more antennas at the top of the base station tower (not shown) is referred to as the AISG protocol.

FIG. 1 shows microcontroller 102 having, at one of its input/output (I/O) ports on path 116, signals representing information that is part of the AISG protocol. It should be understood that microcontroller 102 can be implemented as a computer, a microprocessor, a microcomputer, a server or any well known computing machine that is able to process information based on received signals and a set of executable commands (e.g., a computer program). Although not shown, it is understood that microcontroller 102 has a reset input which causes the microcontroller to restart its operation as dictated by its stored program as will be discussed herein. The base station or the communication network provides on main path 140 a DC (Direct Current) voltage having a certain range (e.g., 10 volts to 30 volts DC). The provided DC voltage has an associated total current ($I_T$) on main path 140. Part of the total current $I_T$ is carried by path 120 to a first regulator 104 and another part of $I_T$ is carried by path 122 to a second regulator 110. A current sensor 114 is positioned with respect to path 140 to measure or sense the total current $I_T$ flowing through path 140. The current sensor 114 can any one of well known circuits or devices (or both) used to sense the amplitude of a current flowing though a electric current conducting medium such as a wire or a metallic land on a printed circuit board. Various integrated circuit current sensors (e.g., AD8217) are available and can be used as a component in the dual mode regulator disclosed herein. The current sensor 114 or the microcontroller 102 (or the combination of both the microcontroller 102 and the current sensor 114) may contain the circuitry that provides the value (i.e., amplitude) of the sensed current onto path 118 in a format that can be understood or ascertained by microcontroller 114. The microcontroller may then process the sensed current information in accordance with commands or executions (e.g., a computer program) stored therein.

In the example embodiment of FIG. 1, the first regulator 104 is a switching regulator (also referred to as a switcher) and the second regulator 110 is a linear regulator. Switching regulator 104 LNA 108 via path 124A, controllable switch 106 and path 124B. The current from switching regulator 104 flows through path 124A, controllable switch 106 (when in a closed state) and path 124B to LNA 108, is hereinafter referred to as the input current of the amplifier (e.g., LNA 108). When the input current of LNA 108 has a value that falls within a defined acceptable current range, LNA 108 is deemed to be operating properly and the input current is referred to as the operating current. The input current of LNA 108 is sensed by current sensor 138 and the sensing information is provided to microcontroller 102 via path 128. Current sensor 138 may be similar to or the same type as current sensor 114. Current sensor 138 is positioned with respect to path 124B to sense the input current and thus provides to the microcontroller 102—via path 128—the value of the amplitude of the input current of the amplifier 108 in a format recognizable to microcontroller 102.

Microcontroller 102 thus senses the total current on main path 140 and the input current of amplifier 108 when controllable switch 106 is in a closed state. Microcontroller 102 controls the operation of switch 106 via control path 126, and controls pulse width modulator (PWM) 136 via control path 130. When controllable switch 106 is in an open state, no current flows from switching regulator 104 to amplifier 108; in such a case, the amplifier 108 is said to be dc-activated. Thus, the microcontroller can de-activate the amplifier 108 by causing switch 106 to open. On the other hand when switch 106 is in a closed state, current flows from switching regulator 104 to path 124A through switch 106 and onto LNA 108 via path 124B as previously described. Thus microcontroller 102 is able to activate or de-activate LNA 108 by closing or opening switch 106 respectively. Switch 106 can be implemented in well known fashion through the use of integrated circuits or through the use of discrete semiconductor components such as transistors. In sum, switch 106 is able to allow current used by LNA 108 (provided by switching regulator 104) to flow to LNA 108 causing LNA to be activated and to operate properly when it is using a current that is equal to an operating current.

In other embodiments, microcontroller 102 can de-activate or activate LNA 108 directly; that is, LNA 108 can be designed with a control input (not shown) coupled to microcontroller 102 to allow the microcontroller 102 to activate or de-activate LNA 108 and switch 106 is replaced by a conductive path directly coupled to paths 124A and 124B. In yet another embodiment, again paths 124A and 124B are directly coupled to each other where switch 106 is part of LNA 108 and can be controlled by microcontroller 102 to activate or de-activate amplifier 108. LNA 108 is said to be activated when it is operating in the manner for which it was designed. That is, when LNA 108 is able to amplify signals applied to its signal input (not shown) and is being provided an input current, the amplifier is said to be activated. When the input current value is within the defined acceptable current range, the amplifier is activated and is operating properly.

Pulse width modulator (PWM) 136 is designed to generate pulse width modulated signals on path 134 based on control signals it receives from microcontroller 102 via control path 130. Thus the VDCL 112 is a microcontroller controlled circuit or system or both capable of varying the resistance presented to the second regulator 110 based on control signals applied to the control input of the VDCL from the microcontroller. The pulses on path 134 are received by variable dummy current load (VDCL) 112 which provides a load (preferably a resistive load) to second regulator (preferably a linear regulator) 110. By controlling the duty cycle of the pulses generated by PWM 136, the microcontroller is able to change the resistance that the VDCL 112 presents to regulator 110. That is, VDCL 112 is a circuit whose input resistance as seen from the output of regulator 110 can be changed based on the control signals (e.g., PWM signals) present on path 131. The PWM signals on path 132 are based on the particular control signals being generated on control path 130 by microcontroller 102. In another embodiment, a filter (preferably a low pass filter) is positioned between PWM 136 and VDCL 112 to filter the PWM pulses and output a filtered PWM signal that changes the input resistance of VDCL 112 as seen from the output of second regulator 110. VDCL 112 thus presents a certain varying load to regulator 110 to cause the output current of second regulator 110 (i.e., current on path 132) to change. Thus, any change in the load presented by VDCL 112 to regulator 110 will cause a certain amount of change in the current on path 132, which will accordingly cause a change in the input current to regulator 110 on path 122. In this manner, the microcontroller will be able to increase or decrease the amount of current flowing though path 122 and ultimately the amount of total current flowing through main path 140.

It should be noted that the VDCL 112 and PWM 136 are well known circuits that can be implemented in many ways. For example VDCL 112 can be designed with transistors (and also capacitors and resistors) that are biased at a certain biasing point to cause them to sink a certain amount of current. The amount of current sunk by the VDCL can change (increase or decrease) depending on the duty cycle or other characteristics of the PWM signal (filtered or unfiltered) on path 134. The VDCL 112 is designed to have at least one control input which is coupled to an output of PWM 136 that generates pulse width signals to vary the voltage presented by VDCL 112 to the second regulator 110 thus varying the current from linear regulator 110 to VDCL 112. The PWM can be implemented with transistors, off-the-shelf integrated circuits, or other semiconductor circuit or components. It will be understood that microcontroller 102 can control VDCL 112 to present an open circuit to linear regulator 110. When linear regulator 110 is not coupled directly or indirectly to any other load it will have no current at its output; that is there will be no current on path 132. In such a case, linear regulator 110 is de-activated. Similarly, when microcontroller 102 controls switch 106 to be in an open state, there is no current flow on paths 124A or 124B and with switching regulator 104 not driving any other load (other than LNA 108—now no longer coupled to switching regulator 104) there is no current on path 124 and thus on path 120. As such the switching regulator is de-activated. By having the ability to activate or de-activate switching regulator 104, LNA 108, and linear regulator 110, the microcontroller 102 is able to operate the example embodiment of the dual mode regulator of FIG. 1 in accordance with an example embodiment of a method of operation as shown in FIG. 2.

Figure 2:
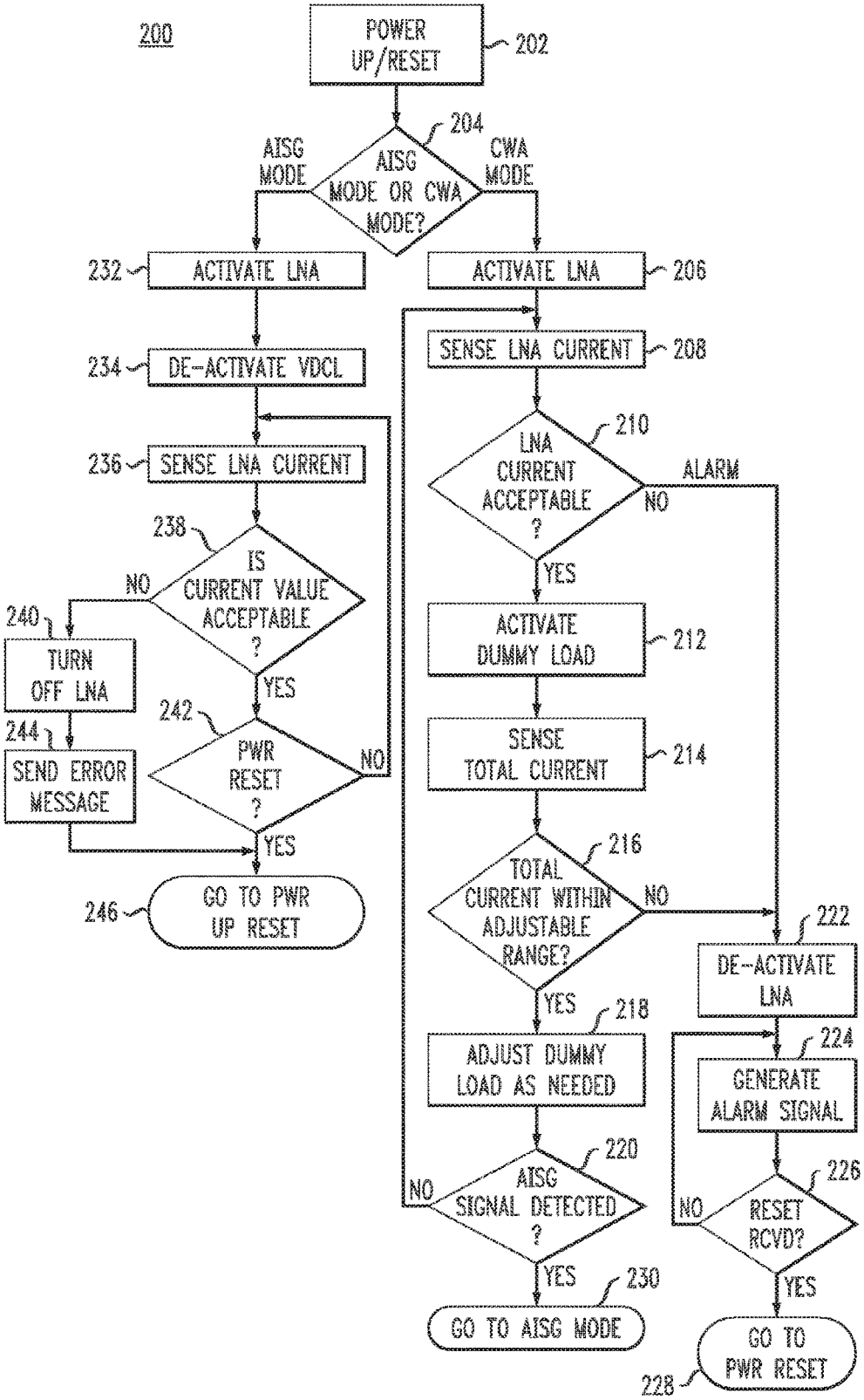

Referring now to FIG. 2, an example embodiment of a method of operation of the dual mode regulator system 200 is shown. In step 202, the microcontroller 102 is reset and thus starts to execute its stored commands (i.e., stored program). It should be understood that during reset and immediately thereafter, microcontroller 102 de-activates LNA 108 through the switch 106.

In step 204 microcontroller 102 monitors (continuously or continually or both in alternate fashion) its AISG I/O port to determine whether there are AISG protocol signals (i.e., AISG messages) on path 116. If AISG protocol signals are present the method of this example embodiment moves to step 232 wherein the microcontroller 102 operates the dual mode regulator in an AISG mode. If, however, there are no protocol signals detected by microcontroller 102 on path 116, the method of this example embodiment moves to step 206 wherein the microcontroller operates in a CWA mode.

AISG Mode of Operation

In step 232—referring temporarily to FIG. 1—microcontroller 102 activates LNA 108 by generating a control signal onto path 126 to cause controllable switch 106 to be in a closed state thus allowing LNA 108 to present a load to regulator 104 and to therefore operate and sink operating current via path 124B as needed. LNA 108 is thus activated. After activating LNA 108, the method of this example embodiment moves to step 234 wherein microcontroller 102 adjusts VDCL so as to present a relatively high resistive load to linear regulator 110 thus effectively maintaining linear regulator 110 and VDCL 112 in a de-activated state. It should be noted that in the AISG mode, the microcontroller is able to send and receive AISG protocol messages via at least path 116 connected to an I/O port of the microcontroller 102. The AISG protocol messages (e.g., AISG protocol signals) may be from base station equipment, such as an antenna or antenna system that is part of a communication network to which the base station belongs. Further the amplifier 108 mounted at the top of the base station may be part of the antenna system.

In step 236, microcontroller 102 senses the input current of LNA 108 (i.e., current on path 124B) using information it receives from current sensor 138 via path 128. The microcontroller 102 may sense the input current continuously, continually or both in alternate fashion. In step 238, microcontroller 102 determines whether the current value of path 124B (i.e., LNA current) is within acceptable range. Depending on the voltage applied onto total path 140 and the nominal operating current of LNA 108, the input current of LNA 108 will have a nominal value plus and minus an acceptable tolerance. The tolerance value is typically expressed as a percentage of the nominal value and is usually defined by the operators of the base station within which the dual mode regulator is operating. For example, if the nominal operating current of the LNA is 60 mA (milliamps) for a certain input voltage range of 20V to 28V, and the tolerance is 30% (i.e., 30% of 60 mA), then the acceptable operating range is 42 mA-78 mA. If the input current to LNA 108 is deemed acceptable (i.e., input current to LNA 108 is within the defined acceptable operating range) the method of this example embodiment moves to step 242 where microcontroller 102 checks for power reset. If no power reset has been received, the microcontroller 102 continues to monitor the input current of LNA 108. If there is a power reset detected at step 242, microcontroller 102 returns to the initial power up reset step 202 via step 246 as shown. Returning to step 238, if the input current value of LNA 108 does not fall within the defined acceptable range, the method of this example embodiment deactivates LNA 108 (step 240), sends an AISG error message over its output port (not shown) indicating a non-operable amplifier (i.e., LNA 108 not operating properly) and returns to the initial power up reset step 202 of this method via step 246. It should be noted that the terms "nominal operating current" or "operating current" as they relate to a component, device or circuit refer to a particular current value which when applied to such device, component or circuit allows the circuit to operate in a certain acceptable manner for which the circuit, component or device is designed.

Still referring to FIG. 2, returning to step 204 of the method of this example embodiment, if the microcontroller 102 does not detect any AISG signaling on path 116, the method of this example embodiment moves to step 206 and enters into the CWA mode of operation.

CWA Mode of Operation

In step 206, microcontroller 102 activates LNA 108 by causing controllable switch 106 to be in a closed state thus allowing LNA 108 to have the current it needs—from switching regulator 104—to operate properly. Further, microcontroller 102 activates VDCL 112 so that a load is presented to the output of linear regulator 110 allowing current to flow on path 132 to the load presented by VDCL 112. As a result of both linear regulator 110 and LNA 108 being activated, there exist currents on paths 120 and 122 respectively. The sum of these currents is total current $I_T$ on main path 140.

A first requirement of the CWA mode is that the regulator for the amplifier of a base station be able to operate at a constant current (having an amplitude defined by operators of the base station, for example) for a particular range of input voltage being provided to regulator by a power supply source of the base station. From the standpoint of the power supply source of the base station, the regulator for amplifier 108 is the example dual mode regulator embodiment of FIG. 1 and the current being supplied to that regulator is $I_T$. Therefore, to meet the first requirement of the CWA mode, $I_T$ is to remain constant (at a defined amplitude) for a range of input voltages from a power source of the base station. For example, say the input voltage range from the base station is 10V-30V DC. Further, say the communication system, of which the base station is a part, requires a constant regulator current of 100 mA. Thus, for the example embodiment of a dual mode regulator of FIG. 1, $I_T$ is to be maintained at a value of 100 mA+/−a tolerance value. The tolerance value may be, for example, 20% of the nominal value or 20 mA for the case being discussed. Thus, the acceptable range for $I_T$ for this example is 80 mA to 120 mA. Continuing with the example being discussed, say for a 10V input voltage to the dual mode regulator 100 of FIG. 1, $I_T$ is 100 mA and this current would be totally used by switching regulator 104. For a 30V input to the dual mode regulator, switching regulator would consume 33 mA; that is, there would be current of 33 mA on path 120. Because $I_T$ is to be maintained at 100 mA, microcontroller 102 would sense $I_T$ and upon detecting the 33 mA value microcontroller would adjust the resistive load presented by VDCL 112 to linear regulator 110 to cause the current on path 122 to be equal to 67 mA so that $I_T$ is maintained at the 100 mA requirement.

Thus, in step 208, microcontroller 102 senses the input current to LNA 108. The value of the current sensed on path 124B falling within the acceptable range for the operating current of the LNA indicates that the LNA is operating properly; this is determined in step 210. However, if in step 210 the input current of the LNA 108 does not fall within an acceptable range, the method of this example embodiment enters the alarm state (the second requirement of the CWA mode) and moves to step 222.

A. Alarm State

In step 222 microcontroller 102 dc-activates LNA 108 by causing controllable switch 106 to be in an open state. Microcontroller 102 temporarily de-activates VDCL 112 and thus linear regulator 110. Microcontroller 102 achieves the deactivation of VDCL 112 (and thus linear regulator 110) by adjusting the resistance VDCL 112 so that a relatively very high resistance (effectively an open circuit) is seen by linear regulator 110. In step 224, as part of the second requirement of the CWA mode, microcontroller activates VDCL 112 to increase the current being sunk on path 122 through the linear regulator 110 to a defined alarm current value. Because the LNA 108 is de-activated (thus no current on path 120), the total current $I_T$ on path 140 is thus the alarm current. The alarm current value is typically defined by the operators of the base station of which the dual regulator 100 is a part. The alarm current value is typically much higher than the constant current value that appears on path 140 during proper operation of the dual mode regulator. The value of the alarm is typically defined by the base station operator. For example, the amplitude of the alarm current can be 200 mA or 250 mA for a case where the total current is 100 mA. The base station or communication network equipment is able to detect the alarm current as it appears on path 140. Microcontroller 102 will continue to cause the alarm signal to occur until the dual mode regulator receives a power reset signal. The occurrence of an alarm signal is usually an indication that the dual mode regulator is no longer operational and should be replaced. Upon receipt of a power reset signal, the dual mode regulator returns to step 202 via step 228 and continues operation accordingly.

Returning to step 210, if the LNA sensed current value falls within an acceptable range, the method of this example embodiment moves to step 212 where microcontroller 102 generates control signals on path 130 to generate the proper pulse width modulated signals on path 134. In this manner the resistive load seen by linear regulator 110 is adjusted so that the current on path 132 is adjusted and thus the current on path 122 is also adjusted allowing the total current $I_T$ on path 140 to be continuously or continually (or both in an alternate manner) to be at a value that falls within an acceptable range of the defined constant total current value. In step 214 the microcontroller 102 senses the total current on path 140 and in step 216 confirms that the value of the total current $I_T$ on path 140 does fall within the acceptable range and does remain constant within that range. If the value of $I_T$ does not fall within the acceptable range or does not remain within such range, the method of this example embodiment moves to the Alarm state, viz., to step 222 and proceeds accordingly as described above. If, however, $I_T$ does remain constant within the acceptable range, the method of this example embodiment moves to step 218 where microcontroller controls the VDCL 112 to ensure that the total current $I_T$ remains constantly within the acceptable range. In step 220, microcontroller 102 checks whether the dual mode regulator is still in the CWA mode. The microcontroller does this by monitoring (continually, continuously or both in alternate fashion) its I/O port connected to path 116. If there are no AISG protocol signals on path 116, the dual mode regulator remains in the CWA mode and the method of this example embodiment returns to step 208 and proceeds accordingly. If, however, ABG protocol signals are detected by microcontroller 102, the method of this example embodiment moves to step 234 thus returning to the AISG mode of operation. Thus, in the first mode of operation (e.g., CWA mode), the microcontroller causes an alert signal to occur upon detecting an improper total current amplitude on the main path 140, or an improper current amplitude on the first regulator (104) path 120 or an improper current amplitude on the main path and the first regulator path.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A dual mode regulator for an amplifier, the dual mode regulator comprising:

a microcontroller;

a first regulator for driving the amplifier;

a variable dummy current load (VDCL) controlled by the microcontroller;

a second regulator for driving the VDCL, wherein respective inputs of the regulators form a main path coupled to a power source, the main path carrying a total current applied to the regulators with the first regulator providing an operating current to the amplifier; and a first current sensor coupled to the main path and a second current sensor coupled to a first regulator path directly coupled to the amplifier, wherein in a first mode of operation, the microcontroller controls the VDCL and the amplifier to maintain a constant total current and the microcontroller generates an alert signal upon detecting an alarm condition based on amplitudes of the total current or the operating current of the amplifier, and wherein, in a second mode of operation, the microcontroller controls the VDCL to deactivate the second regulator, and wherein the first current sensor [and the second current sensor are] *is* capable of detecting the current [amplitudes] *amplitude* on the main path and *the second current sensor is capable of detecting the current amplitude* on the first regulator path directly coupled to the amplifier during operation.

2. The dual mode regulator of claim 1 where the amplifier and power source are part of base station equipment of a communication network.

3. The dual mode regulator of claim 1 where the amplifier is a Low Noise Amplifier (LNA).

4. The dual mode regulator of claim 1 where the microcontroller is one of a computer, a microprocessor, a microcomputer, and a server.

5. The dual mode regulator of claim 1 where the first regulator is a switching regulator.

6. The dual mode regulator of claim 1 wherein the second regulator is a linear regulator.

7. The dual mode regulator of claim 1 wherein the VDCL is a circuit or system having at least one control input coupled to an output of a [microcontroller controlled] pulse width modulator configured to generate pulse width signals modulated for varying resistance presented by the VDCL to the second regulator causing current from the second regulator to the VDCL to vary*, the pulse width modulator being controlled by the microcontroller*.

8. The dual mode regulator of claim 7 where the VDCL is a microcontroller controlled circuit or system or both capable of varying the resistance presented to the second regulator based on control signals applied to the at least control input of the VDCL from the microcontroller.

9. The dual mode regulator of claim 1 where in the first mode, the microcontroller generates the alert signal upon detecting an improper total current amplitude on the main path, an improper current amplitude on the first regulator path or an improper current amplitude on the main path and the first regulator path.

10. The dual mode regulator of claim 9 further comprising a microcontroller controlled switch coupled in series with the first regulator path, which the switch is configured to be placed in an open state de-activating the amplifier in the event that the microcontroller generates the alert signal.

11. The dual mode regulator of claim 1 wherein the microcontroller is configured to maintain during first mode operation a constant total current amplitude for a defined range of voltages provided on the main path by the power source.

12. The dual mode regulator of claim 1 wherein the microcontroller has an input configured to receive an Antenna Interface Standards Group (AISG) signal and to monitor said input during operation of the dual mode amplifier.

13. The dual mode regulator of claim 12 wherein the first node is a Current Window-Alarm (CWA) mode, and the microcontroller is configured to maintain the CWA mode on the condition the microcontroller fails to detect any AISG signals on its AISG input.

14. The dual mode regulator of claim 13 where the alert signal generated by the microcontroller during the CWA mode comprises the microcontroller controlling the VDCL to increase the total current on the main path to a defined current value.

15. The dual mode regulator of claim 14 where the defined constant total current amplitude is 100 mA, the first alarm current amplitude is 200 mA and the second alarm current amplitude is 250 mA.

16. The dual mode regulator of claim 12, wherein the microcontroller is configured to enter the AISG mode on the condition that the microcontroller detects at least one AISG signal on its AISG mode input.

17. A method for operating a dual mode regulator system for an amplifier, the method comprises:

determining whether the dual mode regulator system is to operate in a Current Window-Alarm (CWA) mode or an Antenna Interface Standards Group (AISG) mode, the determining including a microcontroller monitoring continually at least one of its I/O ports to determine whether the AISG protocol signal is present on at least one I/O port;

operating the dual mode regulator system in one of the CWA and AISG modes and activating the amplifier it the event that the AISG protocol signal is present; and entering into an alarm mode and deactivating the amplifier when the system detects an alarm condition, wherein during the CWA mode the microcontroller monitors total current being used by the dual mode regulator system with the amplifier connected thereto, and during the AISG mode the microcontroller de-activates a variable dummy current load (VDCL) that draws a load from the total current.

18. The method of claim 17 wherein the microcontroller is part of the dual mode regulator and said microcontroller controls the operation of the dual mode regulator and the operation of the amplifier.

19. The method of claim 17 wherein the *ASIG* protocol signal is from an antenna system of which the amplifier is a portion.

20. The method of claim 19 wherein the antenna system is part of a communication network comprising the amplifier coupled thereto and in which amplifier is mounted at top of a base station of the communication network.

21. The method of claim 17 wherein during operation in the CWA mode, the microcontroller monitors the total current flow to the dual mode regulator system and monitors current usage of the amplifier and the microcontroller further controls the VDCL to maintain the total current flow at a defined constant amplitude.

22. The method of claim 17 wherein during operation in the CWA mode, the microcontroller generates an alarm signal when the total current flow amplitude is outside a predefined range or when the current usage by the amplifier is outside another predefined range, and the microcontroller resets the system upon detecting a reset signal.

23. The method of claim 22 wherein the microcontroller the alarm signal comprises the microcontroller toggling the total current between a first value and a second value where each of the first value and the second value is greater than the total current value during operation in the CWA mode.

24. The method of claim 17 wherein during operation in the AISG mode, the microcontroller senses current being used by the amplifier.

25. The method of claim 22 wherein during operation in the AISG mode, the microcontroller de-activates the amplifier upon detecting an unacceptable current being used by the amplifier and performs a system power reset.

* * * * *